United States Patent [19]
Malec

[11] Patent Number: 5,612,647
[45] Date of Patent: Mar. 18, 1997

[54] RF POWER AMPLIFIER SYSTEM HAVING AN IMPROVED DRIVE SYSTEM

[75] Inventor: Jeffrey M. Malec, Quincy, Ill.

[73] Assignee: Harris Corporation, Melbourne, Fla.

[21] Appl. No.: 497,390

[22] Filed: Jun. 30, 1995

[51] Int. Cl.$^6$ ..................................................... H03F 3/26
[52] U.S. Cl. ............................................. 330/146; 330/295
[58] Field of Search ............................. 330/51, 146, 277, 330/295

[56] References Cited

U.S. PATENT DOCUMENTS

| | | | |
|---|---|---|---|
| 4,117,415 | 9/1978 | Hoover | 330/146 X |
| 4,580,111 | 1/1986 | Swanson | 332/41 |
| 4,949,050 | 8/1990 | Swanson | 330/298 |
| 5,003,271 | 3/1991 | Swanson | 330/146 X |

FOREIGN PATENT DOCUMENTS

0194602  10/1985  Japan ...................................... 330/146

Primary Examiner—Steven Mottola
Attorney, Agent, or Firm—Tarolli, Sundheim, Covell, Tummino & Szabo

[57] ABSTRACT

An RF power amplifier is presented herein including an RF source for providing a train of RF pulses having a fixed frequency and wherein each pulse is of a fixed amplitude and duration. A bridge circuit includes a first circuit having a first transistor switching means for, when on, connecting a DC voltage source across a load for DC current flow therethrough in a first direction. The bridge circuit includes a second circuit including a second transistor switch for, when on, connecting the DC voltage source across the load for DC current flow therethrough in a second direction. A switch driver control serves, when enabled, to pass the RF pulses for driving the first and second transistor switches on and off at a frequency dependent upon that of the RF signal and in such a manner that current from the DC voltage source alternately flows in the first and second directions through the load. Turn-on signals are provided and selectively applied to the switch driver control for enabling the switch driver control for passing the RF pulses to the transistor switches.

24 Claims, 5 Drawing Sheets

RF POWER AMPLIFIER SYSTEM HAVING AN IMPROVED DRIVE SYSTEM

BACKGROUND OF THE INVENTION

1. Technical Field

This invention relates to the art of AM radio broadcasting and more particularly to an RF power amplifier system of the type employed in AM radio broadcasting together with improved driver circuitry for driving the power amplifiers.

2. Description of the Prior Art

The U.S. Patents to H. I. Swanson U. S. Pat. No. 4,580,111 and 4,949,050 disclose an amplitude modulator for use in AM radio broadcasting and wherein the modulator serves to generate an amplitude modulated carrier signal by selectively turning on and off a plurality of RF amplifiers in a digital manner to produce amplitude modulation. Each of the RF amplifiers includes a plurality of switching transistors, each of which may take the form of a MOSFET transistor, connected together in a bridge circuit. This bridge circuit provides output signals to an output combiner. Each of the MOSFET transistors has a gate which is driven by properly phased RF frequency signals that allow the proper MOSFET transistors to be turned on at the correct times. In the arrangement noted in the Swanson patents, the bottom two MOSFET transistors in each bridge circuit are turned on and off to allow each RF amplifier to be turned on or off.

The drive system for driving the RF amplifier MOSFET switching transistors includes a transformer with its own secondary for driving each MOSFET switching transistor. This provides a low impedance source of drive for the gate of each MOSFET switching transistor. This also provides the correct out-of-phase drive to the MOSFET switching transistors. Thus, the bridge arrangement includes upper or high side MOSFET switching transistors and lower or low side MOSFET switching transistors. The correct out-of-phase drive to the MOSFET transistors provides the proper gate voltage with respect to the source voltage. The source voltage may well be on the order of 230 volts DC. For the low side MOSFET transistor drive, the secondary of the transformer is used in conjunction with control transistors to turn the drive on and off to the lower pair of MOSFET switching transistors and which subsequently turn the RF amplifier, itself, on and off. This is discussed in greater detail in the Swanson patents referred to above.

The use of RF transformers for providing the MOSFET transistor drive requires an RF drive signal to the input of each of the MOSFET transistor driver transformers. For proper operation across the frequencies of operation, the input circuits for the RF amplifiers are broad-banded. Consequently, in order to drive the RF amplifier MOSFET switching transistors properly, an RF drive system has been required in previous systems in order to employ a low level oscillator signal at the carrier frequency and then provide enough stages of gain (through tuned circuits and the like) to provide a low impedance drive to the RF amplifier input circuits. In each of the stages, there are losses in the amplifiers, the tuned circuits, and in the coupling circuits employed.

SUMMARY OF THE INVENTION

It is an object of the present invention to provide improvements in the drive circuit for MOSFET switching transistors in a bridge arrangement, as discussed above, and wherein the improvements eliminate the need for a transformer for driving the MOSFET transistors.

In accordance with the present invention, there is provided an RF power amplifier system. This includes an RF source for providing a train of RF pulses and a DC voltage supply source. Each power amplifier includes a bridge circuit having a first circuit including at least a first transistor switch for, when on, connecting the DC voltage source across a load for DC current flow therethrough in a first direction and a second circuit including a second transistor switch means for, when on, connecting the DC voltage source across the load for DC current flow therethrough in a second direction. A switch driver control serves, when enabled, to pass the RF pulses for driving the transistor switches on and off at a frequency dependent upon the frequency of the RF pulses and in such a manner that current from the DC source alternately flows in the first and second directions through the load. A turn-on signal control means provides turn-on pulses for enabling the switch driver control for passing the RF pulses to the transistor switches.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111, which is assigned to the same assignee as the present invention, the disclosure of which is herein incorporated by reference.

Figure 1:
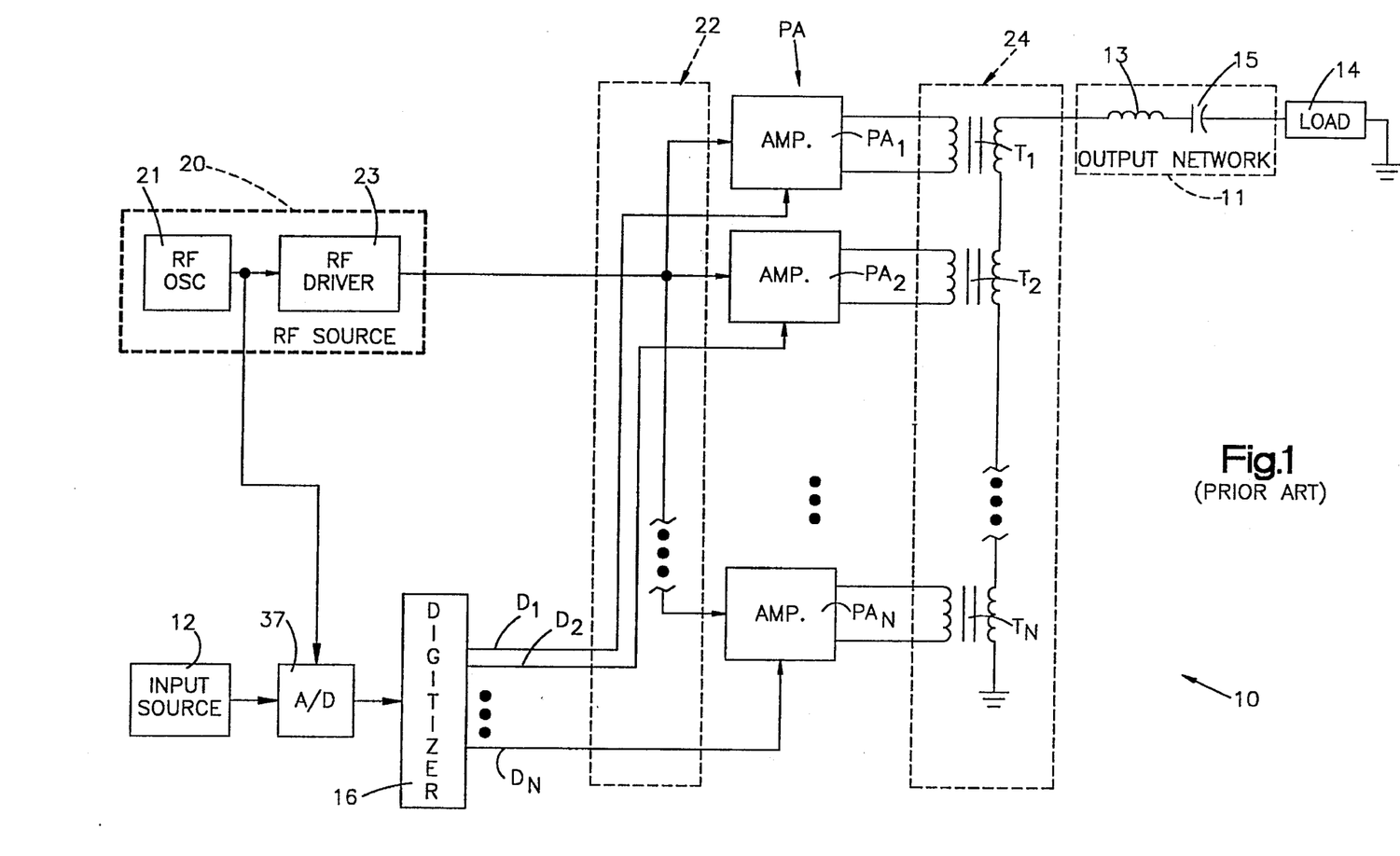
FIG. 1 is a prior art schematic-block diagram illustration of one application to which the present invention may be applied.
Figure 2:
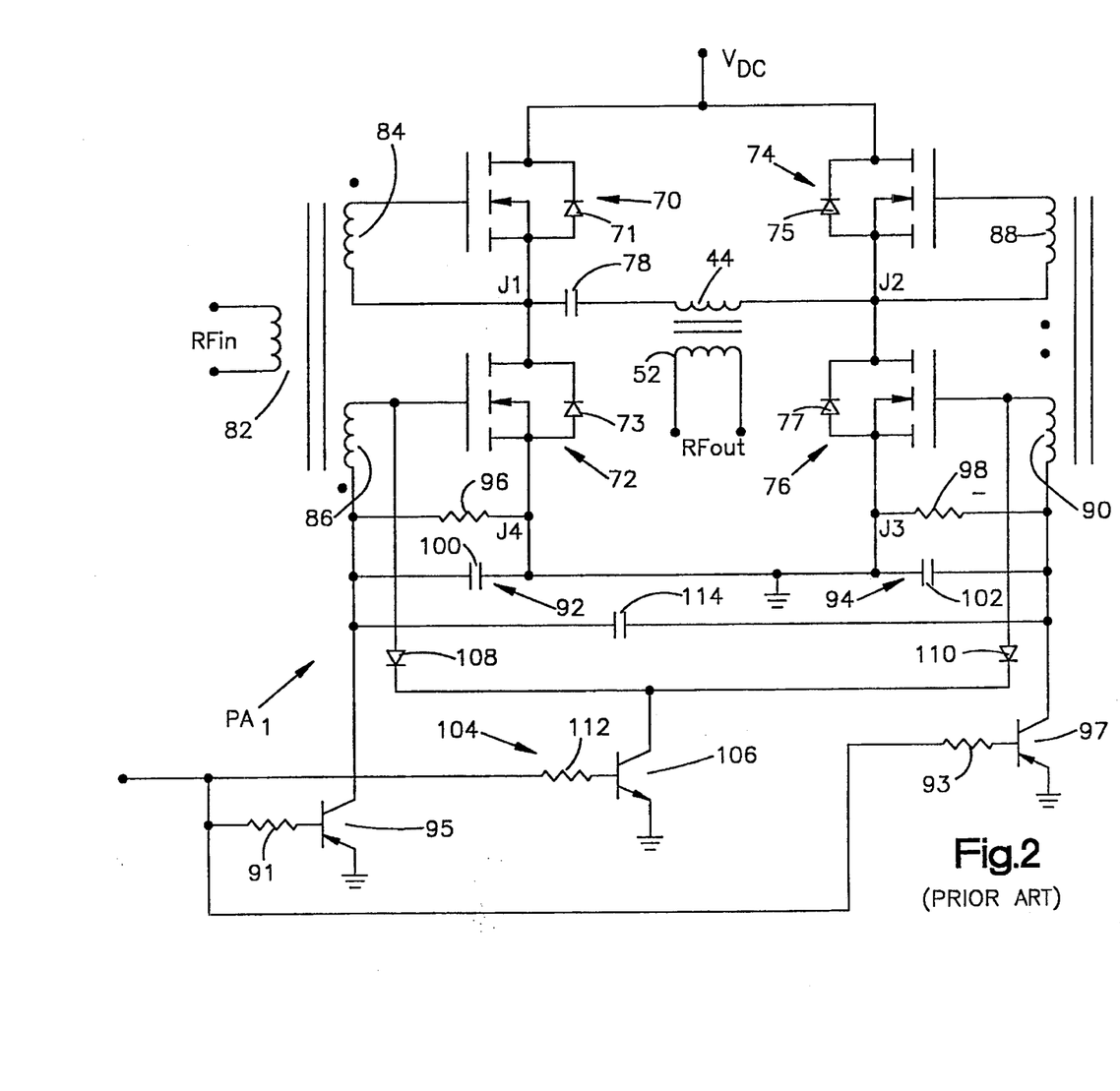
FIG. 2 is a prior art schematic-circuit illustration of one of the power amplifiers employed in FIG. 1.
Figure 2A:
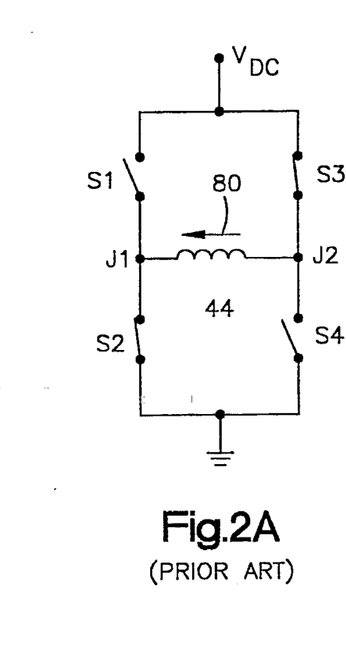
FIG. 2A is a prior art simplified schematic circuit useful in understanding the operation of the circuit shown in FIG. 2.
Figure 3:
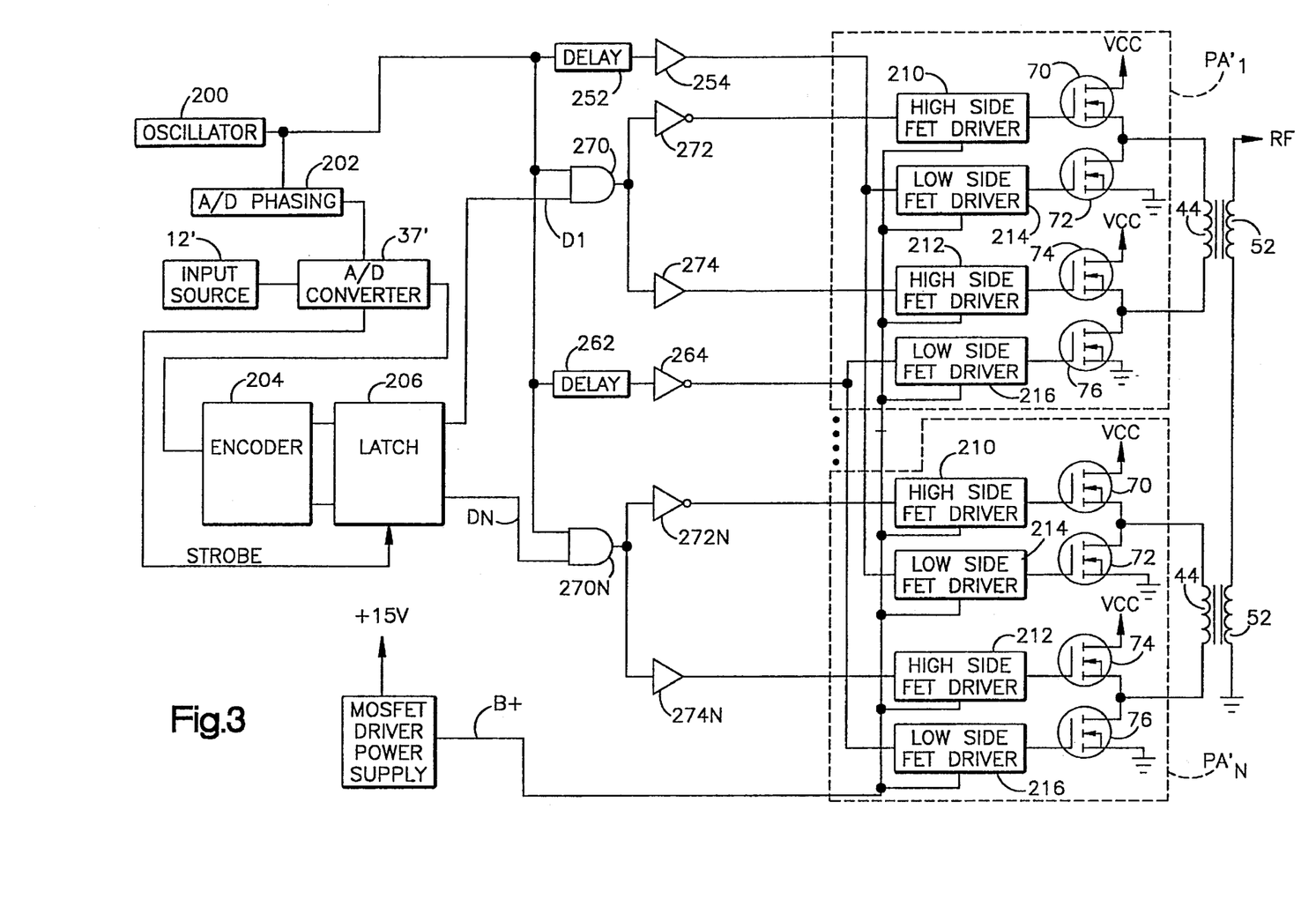
FIG. 3 is a schematic-block diagram illustration incorporating circuitry in accordance with the present invention.

The discussion which follows is directed to an explanation of the operation of the circuitry shown in FIG. 1 followed by a detailed description of a power amplifier as illustrated in FIGS. 2 and 2A herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. This output line includes an output network 11 including an inductor 13 and a capacitor 15. A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $PA_1$–$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$–$PA_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers $T_1, T_2, \ldots, T_N$. The secondary windings act as an independent signal source, whereby the signals provided by the various transformers additively combine with one another to produce a combined signal which is supplied to the load 14e This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$–$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$–$PA_N$.

FIG. 2 illustrates one form which the power amplifier $PA_1$ of FIG. 1 may take, the other power amplifiers $PA_2$–$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer is connected across the bridge junctions $J_1$ and $J_2$ of the four semiconductor elements.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$, and $S_4$. As shown in FIG. 2A, the switch $S_1$ is open and the switch $S_2$ is closed, whereby the common junction $J_2$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$–$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$–$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary transformer windings. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70–76. The secondary 84 is directly connected between the gate MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETS 72 and 76, however in these cases impedance networks 92 and 94 are connected in series with the coils 86 and 90, respectively. Each impedance network 92, 94 includes a parallel combination of a resistor 96, 98 and capacitor 100, 102. The purpose of these impedance networks will be described hereinafter during the description of the amplifier control circuitry 104.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only a fundamental component of this squarewave.

As shown in FIG. 2, the power amplifier $PA_1$ includes a switching circuit 104 for turning the power amplifier on and off in response to the control signal appearing on the digitizer output line $D_1$. The switching circuit 104 includes an NPN bipolar junction transistor 106 having its emitter grounded and its collector connected to the gates of MOSFETs 72 and 76 through corresponding diodes 108 and 110. The base of the transistor 106 is connected to the $D_1$ output of the digitizer 24 through a base resistor 112. When the control signal applied to the base resistor 112 has a high logic level (i.e., logic "1"), base current is applied to the transistor 106, forcing it into a saturation. The gates of the transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier.

The resistors 96 and 98 in the gate circuits of MOSFETs 72 and 76 limit the DC current through transistor 106 when it is saturated. Were these not included the current through the transistor 106 would be quite high because the windings 86 and 90 act as voltage sources. The capacitors 100 and 102 bypass the resistors, reducing their effect at RF frequencies. A third capacitor 114 is connected between both capacitors 100 and 102. This capacitor improves the turn-on/turn-off characteristics of the amplifier.

When the control signal applied to the base of transistor 106 is at a low logic level (i.e. logic "0"), the transistor 106 is cut off and the operation of the amplifier 26 is substantially as described previously However, this logic 0 signal is a negative signal and it serves to turn-on PNP transistors 95 and 97 through base drive resistors 91 and 93, respectively. When these transistors are turned on forcing them into saturation, they, in turn, rapidly drive the MOSFET switching transistors 72 and 76 into saturation.

It is seen from the discussion presented above that each of the RF power amplifiers $PA_1$ through $PA_N$ requires a transformer having a secondary winding associated with the gate of each MOSFET transistor. Thus, as is seen in FIG. 2, the secondary windings 84, 86, 88, and 90 provide the sinusoidal RF driving voltage to the gate electrodes of the MOSFET transistor switches. The driving voltages are required to have the proper phasing so that MOSFET transistors 70 and 76 are on while transistors 72 and 74 are off and vice versa. In addition to the proper phasing of these RF signals, the RF driver 23 (see FIG. 1) includes several stages of amplification. In each of these stages there are losses in the amplifiers, tuner circuits, and coupling circuits.

In accordance with the present invention, there is provided a direct MOSFET transistor drive system wherein the drive transformer toroids of FIG. 2 are replaced with MOSFET driver integrated circuits which have been designed to provide the proper level of MOSFET transistor gate drive using logic level input signals. As will be explained in greater detail, these drivers are employed as high side (upper bridge level) and low side (bottom bridge level) drivers for driving the high side (upper level) and low side (bottom level) of the bridge. These MOSFET gate drivers may take the form of Model No. IR 2110 which are supplied by International Rectifier Corporation. These drivers have sufficient peak current capability to drive most MOSFET transistors at the desired switching speed. Buffer circuits may be employed for driving the MOSFET transistors with higher gate capacitance or paralleled MOSFET transistors whose current requirements are outside of the limits of the MOSFET gate driver integrated circuit itself.

Reference is now made to FIG. 3 which is a schematic-block diagram illustration incorporating circuitry in accordance with the present invention. In view of the similarities between the components employed in FIGS. 1 and 3, similar components in FIG. 3 will be identified with like character references. For example, the power amplifiers $PA_1$ through $PA_N$ in FIG. 1 find their corresponding counterparts in FIG. 3 which are referred to as power amplifiers $PA_1'$ through $PA_N'$. For simplicity, only two power amplifiers are illustrated in FIG. 3.

The signals required to drive the RF power amplifiers using the MOSFET gate drivers, to be described hereinafter, are logic level signals. As will be developed below, the drive signals are squarewave signals at the carrier frequency for turning the MOSFET transistors on and off. As shown in FIG. 3, each of the power amplifiers includes a bridge arrangement including A-side MOSFET transistors 70 and 72 and B-side MOSFET transistors 74 and 76. Transistors 70 and 74 are referred to as the high side transistors and transistors 72 and 76 are referred to as the low side transistors. The RF drive signals supplied to the gates of these MOSFET transistors are such that transistors 70 and 76 are turned on while transistors 72 and 74 are turned off and visa versa. This switching is conducted at the carrier frequency so that current flows in opposite directions through winding 44 in the same manner as that discussed with reference to FIG. 2. The VCC voltage may be on the order of 230 volts DC.

The circuit in FIG. 3 for driving the MOSFET transistors 70, 72, 74, and 76 employs only logic level signals which provide both the proper phase signals as well as the desired switching RF drive signals. This may be accomplished with low level fast logic. Consequently, the circuitry of FIG. 3 may be practiced with an oscillator providing a logic level output which is supplied to a modulation encoder that encodes the digital word into a switch command for the RF amplifiers. The direct drive system of FIG. 3 employs low level logic signals up through the MOSFET driver circuits.

Attention is now directed more specifically to FIG. 3. The RF drive train includes an RF oscillator 200 that produces a squarewave pulse train wherein the pulses are of a fixed amplitude, duration and frequency. The pulses may have a peak-to-peak value on the order of 5 volts DC. The pulse train is supplied through an analog to digital phasing circuit 202 to an A to D converter 37' which receives an audio signal from an input source 12' in the same manner as that set forth in FIG. 1. The analog to digital converter 37' provides a 12 bit digital output pattern to an encoder 204. This encoder has a plurality of N output circuits each corresponding with one of the power amplifiers $PA_1'$ through $PA_N'$. These output circuits are connected to a latch circuit 206 which is strobed by the A to D converter 37'. The latch circuit 206 also has a plurality of outputs each corresponding with one of the power amplifiers $PA_1'$ through $PA_N'$. As in the case of FIG. 1, this circuitry serves to monitor the magnitude of the audio input signal from source 12' and provide a plurality of turn-on signals on the outputs of latch 206 for turning on a plurality of the power amplifiers $PA_1'$ through $PA_N'$ in accordance with the magnitude of the audio input signal. The A to D converter in a conventional fashion provides a conversion at a relatively high frequency and with each conversion, the data is strobed into the latch circuit 206.

If the power amplifier $PA_1'$ is to be turned on, then the associated output circuit from latch circuit 206 will be high. Otherwise, the output circuit will be low or at binary 0 level.

A field effect driver is associated with each of the MOSFET transistors 70, 72, 74, and 76. These include high side field effect drivers 210 and 212 and low side field effect drivers 214 and 216. The high side field effect drivers serve to drive the high side field effect transistors 70 and 74 respectively whereas the low side field effect drivers 214 and 216 serve to drive the low side transistors 72 and 76 respectively.

Figure 4:
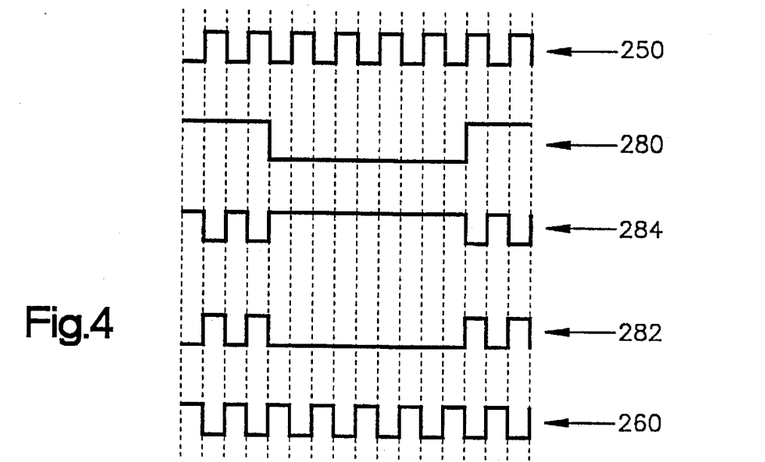
FIG. 4 is a graphical illustration of several waveforms of voltage with respect to time illustrating the operation of the circuitry shown in FIG. 3.

The RF squarewave pulse train obtained from the oscillator 200 is continuously supplied to the low side field effect transistor drivers 214 and 216 but out of phase from each other by 180°. Thus, the squarewave as supplied to the low side field effect transistor driver 214 appears as shown in waveform 250 in FIG. 4. This waveform is taken after the squarewave is passed through a delay circuit 252 and a buffer amplifier 254. A similar waveform, but 180° out of phase, is supplied to the low side field effect transistor driver 216. Thus, the waveform 260 as shown in FIG. 4 represents the signal supplied to the low side field effect transistor driver 216. This is obtained from the oscillator 200 after passage through a delay circuit 262 and an invertor 264. Waveforms 250 and 260 are 180° out of phase with respect to each other. Waveform 260 may be referred to as the 0° waveform, whereas waveform 250 may be referred to as the 180° waveform. The logic level drives corresponding with waveforms 250 and 260 are respectively applied to the A side low level driver and the B side low level driver of all of the power amplifiers $PA_1'$ through $PA_N'$ simultaneously. Consequently, the output of the buffer amplifier 254 and the invertor amplifier 264 are provided with sufficient fan-out capability to drive all of the low side field effect drivers in all of the RF amplifiers simultaneously.

The high side field effect transistor drivers 210 and 212 in each of the power amplifiers are driven with 0° and 180° drive signals. In addition, these drives are also turned on and off by the output from the modulation encoder 204 by way of the latch circuit 206. A logic circuit for each of these RF amplifiers is provided. The following is a description of the logic circuit associated with the power amplifier $PA_1'$.

The logic circuit for $PA_1'$ includes an AND gate 270. This AND gate has one input connected to the output of oscillator 200 and a second input connected to the first output line $D_1$ of the latch circuit 206. The output of the AND gate 270 is applied through an invertor amplifier 272 to the input of the high side driver 210, as well as, through a buffer amplifier 274 to the high side driver 212. These are 180° out of phase with each other. That is, if the AND gate 270 has been enabled by a positive pulse then so long as it is enabled, it will pass the squarewave pulse train obtained from oscillator 200. This is shown by the waveform 280 in FIG. 4 wherein the positive portions of the waveform enable the AND gate so as to pass the squarewave drive pulses from oscillator 200. The pulses that have passed the AND gate 270 are supplied through the buffer amplifier 274 to the high side driver 212 as is seen by the waveform 282 in FIG. 4. The pulses that have passed the AND gate 270 are also inverted by invertor amplifier 272 as is shown by the waveform 284 in FIG. 4, and supplied to the high side driver 210. Thus, the inputs to the high side driver 210 and the high side driver 212 are 180° out of phase from each other.

A similar logic circuit is provided for the high side drivers 210 and 212 of each of the other power amplifiers $PA_1'$ through $PA_N'$. Thus, as is shown with reference to amplifier $PA_N'$, there is provided an AND gate $270_N$, an invertor amplifier $272_N$, and a buffer amplifier $274_N$.

From the foregoing, it is seen that the high side drivers in the RF amplifiers require two logic level drives of 0° and 180° and also require turn-on signals to be provided by the modulation encoder 204 by way of the latch circuit 206. From FIG. 3, it is noted that the RF output from the oscillator 200 drives one input of each of the AND gates 270 and $270_N$. The other input of each AND gate is obtained from latch circuit 206. The number of turn-on signals will be dependent upon the magnitude of the analog input signal obtained from the input source 12'. When one of the RF power amplifiers $PA_1'$ through $PA_N'$ is to be turned on, an associated output of the latch circuit 206 will be high. The AND gate will then be enabled to pass the RF drive signal which is, in turn, split into 0° and 180° signal by the amplifiers 272 and 274.

In practice, the amount of propagation delay in the high side and low side drivers may need to be determined and an appropriate amount of delay added to the low side drivers. This is the purpose of the delay circuits 252 and 262 illustrated in FIG. 3.

Using digital switching signals for driving the MOSFET transistors may require the use of a deadband between the points in time that the upper and lower MOSFET transistors turn on and off. In the prior art, as disclosed in FIGS. 1 and 2, the sinusoidal RF drive to both sets of MOSFET transistors produces a certain amount of deadband or time when neither the upper or lower MOSFET transistors are turned on. This may be used in the present configuration to prevent the possibility of high peak currents which might take place if both sets of MOSFET transistors are turned on at the same time. The deadband circuit will be discussed in greater detail hereinafter with reference to FIG. 5.

Figure 5:
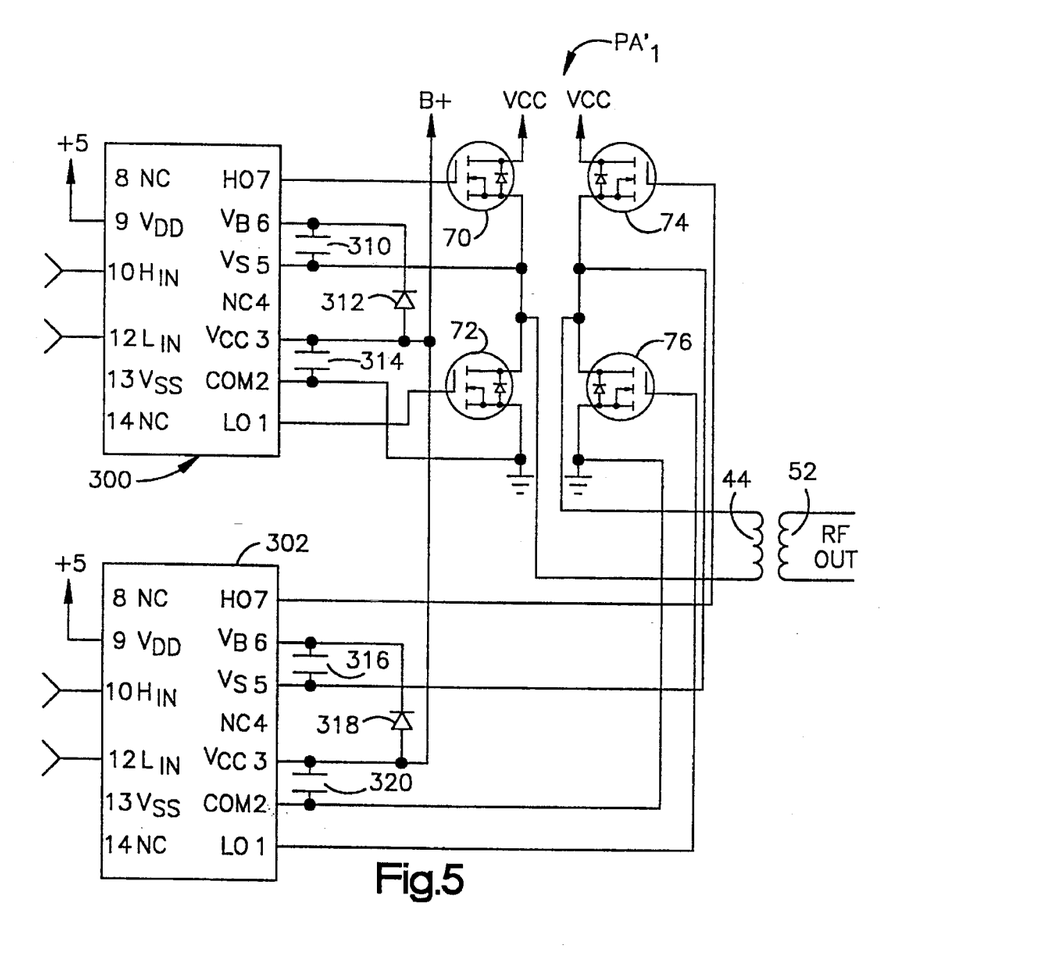
FIG. 5 is a schematic-block diagram illustration of one of the power amplifiers with the improved drive control of the present invention.

Reference is now made to FIG. 5 which illustrates the RF driver circuitry together with the MOSFET transistors in greater detail. This circuit includes an A side MOSFET driver 300 for driving the A side MOSFETs 70 and 72 of an associated power amplifier such as $PA_1'$. Similarly, a B side MOSFET driver 302 serves to drive the B side MOSFET transistors 74 and 76. The A side driver 300 incorporates the high side driver 210 and the low side driver 214 illustrated in FIG. 3. Similarly, driver 302 incorporates the high side driver 212 and the low side driver 216 illustrated in FIG. 3. The A side driver 300 and the B side driver 302 are identical and each takes the form of an integrated circuit model IR 2110 gate driver provided by International Rectifier Corporation. Both the high side and low side drivers are located in one integrated circuit. A boot strap circuit is provided for providing a gate voltage of 15 volts higher than the supply. The boot strap circuit for driver 300 includes a capacitor 310 connected between pins 5 and 6, a diode 312 connected between pins 3 and 6, and a capacitor 314 connected between pins 2 and 3. In a similar fashion, a boot strap circuit is provided for driver 302. This boot strap circuit includes a capacitor 316 connected between pins 5 and 6, a diode 318 connected between pins 3 and 6, and a capacitor 320 connected between pins 2 and 3. The boot strap capacitors are charged by the gating diodes 312 and 318 to the +15 volt supply used for the low side driver when the upper MOSFET transistor is turned off. When the high side MOSFET transistor is required to turn on (input signal to pin 10 is a logic high), the source voltage (pin 5) plus the charged boot strap capacitor voltage are connected from pin 6 to pin 7 and therefore drive the MOSFET gate at a level which is 15 volts above the source voltage. It is to be noted that the high side MOSFET transistors are switched on and off to switch the RF and the low side MOSFET transistors are on continuously. This is to accommodate the boot strap method of obtaining the high side MOSFET supply. It is to be appreciated that in the prior art version as shown in FIG. 2, the low side MOSFET transistors are turned on and off and the high side MOSFET transistors continuously receive an RF signal.

Figure 6:
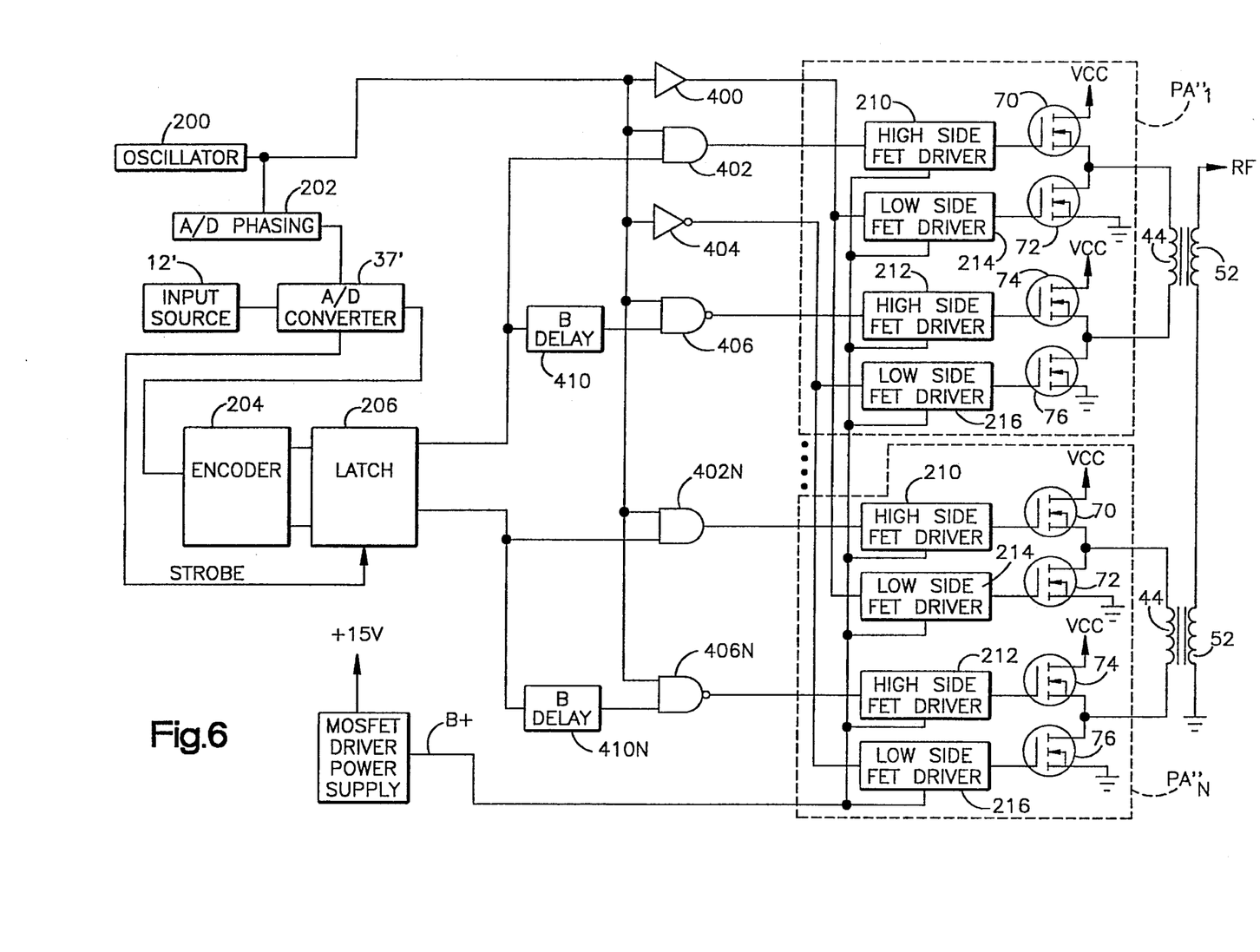
FIG. 6 is a schematic-block diagram illustration of a second embodiment incorporating circuitry in accordance with the present invention.

Attention is now directed to the embodiment of the invention as illustrated in FIG. 6. This is a schematic-block diagram illustration of an embodiment employing means for delaying the passage of a turn-on signal to the MOSFET transistor driver 212. Additionally, the logic circuitry for driving the MOSFET transistor drivers 210, 212, 214, and 216 has been modified somewhat but accomplishes essentially the same result as that discussed hereinabove with reference to FIG. 3.

Referring again to FIG. 6, it is seen that the low side field effect transistor drivers 214 and 216 continuously receive RF squarewave signals from the oscillator 200. These signals are out of phase with each other by 180°. That is, the RF signals continuously supplied to the low side driver 216 in each of the power amplifiers is supplied through an invertor amplifier 404 and this is considered the 0 phase signal. Similarly the RF signal supplied to the low side drivers 214 is supplied through an amplifier 400 and these signals are considered the 180° signals. Also, the high side drivers 210 and 212 are driven by the RF signals only when their associated gates 402 and 406 are enabled. Gate 402 is enabled by an output of the latch 206. The same output of the latch circuit 206 is supplied by way of a delay 410 to a gate 406 which is enabled in the opposite manner of that from gate 402 by the same output latch 206. The circuitry associated with each of the other power amplifiers is identical to that described above relative to the logic circuitry for amplifier PA₁". It is seen that the delay circuit 410 is incorporated so that the digital drive that turns on the B side MOSFET transistors 74 and 76 takes place after that for the transistors for the A side.

From the foregoing, it is seen that the RF drive chain in accordance with the embodiments shown in FIGS. 4 and 6 provides a simpler construction than that employed in the prior art shown in FIGS. 1 and 2 herein. That is, the circuitry in accordance with the present invention achieves a substantial reduction in complexity of the RF drive chain, and digital drive circuitry of a digitally modulated AM transmitter. This provides higher overall efficiencies and lower product cost.

Although the invention has been described in conjunction with preferred embodiments, it is to be appreciated that various modifications may be made without departing from the spirit and scope of the invention as defined by the appended claims.

Having described the invention, we claim the following:

1. A RF power amplifier system, comprising:

a RF source for providing a train of RF pulses having a fixed frequency and wherein each pulse is of a fixed amplitude and duration;

a DC voltage source;

a bridge circuit including a first circuit including a first transistor switching means for, when on, connecting said DC voltage source across a load for DC current flow therethrough in a first direction and a second circuit including a second transistor switching means for, when on, connecting said DC voltage source across said load for DC current flow therethrough in a second direction;

switch driver control means for, when enabled, passing said RF pulses for driving said first and second transistor switching means on and off at a frequency dependent upon that of said RF signal and in such a manner that current from said DC voltage source alternately flows in said first and second directions through said load;

means for providing turn-on signals and selectively applying them to said switch driver control means for enabling said driver control means for passing said RF pulses to said switching means; and, wherein said switch driver control means includes logic gating means enabled by said turn-on signal for passing said RF pulses to said first and second transistor switching means.

2. A RF power amplifier system, comprising:

a RF source for providing a train of RF pulses having a fixed frequency and wherein each pulse is of a fixed amplitude and duration;

a DC voltage source;

a bridge circuit including a first circuit including a first transistor switching means for, when on, connecting said DC voltage source across a load for DC current flow therethrough in a first direction and a second circuit including a second transistor switching means for, when on, connecting said DC voltage source across said load for DC current flow therethrough in a second direction;

switch driver control means for, when enabled, passing said RF pulses for driving said first and second transistor switching means on and off at a frequency dependent upon that of said RF signal and in such a manner that current from said DC voltage source alternately flows in said first and second directions through said load;

means for providing turn-on signals and selectively applying them to said switch driver control means for enabling said driver control means for passing said RF pulses to said switching means; and, delay means for delaying application of a said turn-on signal to said second transistor switching means.

3. A system as set forth in claim 2 wherein said delay means is interposed between said turn-on signal providing means and said switch driver control means.

4. A system as set forth in claim 2 wherein said first and second transistor switching means are each field effect transistors.

5. A system as set forth in claim 4 including field effect transistor driver means interposed between said switch driver control means and each of said field effect transistor means.

6. A RF power amplifier system, comprising:

a RF source for providing a train of RF pulses having a fixed frequency and wherein each pulse is of a fixed amplitude and duration;

a DC voltage source;

a bridge circuit including a first circuit including a first transistor switching means for, when on, connecting said DC voltage source across a load for DC current flow therethrough in a first direction and a second circuit including a second transistor switching means for, when on, connecting said DC voltage source across said load for DC current flow therethrough in a second direction;

switch driver control means for, when enabled, passing said RF pulses for driving said first and second transistor switching means on and off at a frequency dependent upon that of said RF signal and in such a manner that current from said DC voltage source alternately flows in said first and second directions through said load;

means for providing turn-on signals and selectively applying them to said switch driver control means for enabling said driver control means for passing said RF pulses to said switching means;

said bridge circuit includes third and fourth transistor switching means; and wherein said third transistor switching means is connected in series in said second circuit with said second transistor switching means such that when both said second and third transistor switching means are on they connect said DC voltage source across said load for DC current flow therethrough in said second direction and wherein said fourth transistor switching means is connected in series with said first circuit with said first transistor switching means such that when both said first and fourth transistor switching means are on they connect said DC voltage source across said load for DC current flow therethrough in said first direction.

7. A system as set forth in claim 6 wherein said switch driver control means includes logic gating means enabled by a said turn-on signal for passing said RF pulses to said first and second transistor switching means.

8. A system as set forth in claim 7 including a delay means for delaying application of a said turn-on signal to said second transistor switching means.

9. A system as set forth in claim 8 wherein said delay means is interposed between said turn-on signal providing means and said switch driver control means.

10. A system as set forth in claim 9 wherein each of said transistor switching means is a field effect transistor.

11. A system as set forth in claim 10 including field effect transistor driver means interposed between said switch driver control means and each of said field effect transistor means.

12. A system as set forth in claim 11 wherein each said field effect transistor is a MOSFET transistor.

13. A RF power amplifier system comprising:

a RF source for providing a train of RF pulses at a fixed frequency with each pulse being of a fixed magnitude and duration;

a DC voltage source;

a plurality of RF power amplifiers, each amplifier including a bridge circuit having a pair of input terminals for connection across a DC voltage source and a pair of output terminals connected across a load;

each said bridge circuit including a first circuit having at least a first transistor switching means for, when on, connecting said DC voltage source across said load for DC current therethrough in a first direction and a second circuit including a second transistor switching means for, when on, connecting said DC voltage source across said load for DC current therethrough in a second direction;

a plurality of switch driver control means each associated with one of said RF power amplifiers for, when enabled, passing said RF pulses for driving said first and second transistor switching means on and off at a frequency dependent upon that of said RF pulses and in such a manner that current from said DC source alternately flows in said first and second directions through said load;

turn-on signal means for providing turn-on signals for enabling at least one of said driver control means in dependence upon the magnitude of an input signal; and, wherein each said switch driver control means includes logic gating means enabled by a said turn-on signal for passing said RF pulses to said first and second transistor switching means.

14. A RF power amplifier system comprising:

a RF source for providing a train of RF pulses at a fixed frequency with each pulse being of a fixed magnitude and duration;

a DC voltage source;

a plurality of RF power amplifiers, each amplifier including a bridge circuit having a pair of input terminals for connection across a DC voltage source and a pair of output terminals connected across a load;

each said bridge circuit including a first circuit having at least a first transistor switching means for, when on, connecting said DC voltage source across said load for DC current therethrough in a first direction and a second circuit including a second transistor switching means for, when on, connecting said DC voltage source across said load for DC current therethrough in a second direction;

a plurality of switch driver control means each associated with one of said RF power amplifiers for, when enabled, passing said RF pulses for driving said first and second transistor switching means on and off at a frequency dependent upon that of said RF pulses and in such a manner that current from said DC source alternately flows in said first and second directions through said load;

turn-on signal means for providing turn-on signals for enabling at least one of said driver control means in dependence upon the magnitude of an input signal; and, delay means associated with each said power amplifier for delaying application of a said turn-on signal to said second transistor switching means in said power amplifier.

15. A system as set forth in claim 14 wherein said delay means is interposed between said turn-on signal providing means and said switch driver control means in said power amplifier.

16. A system as set forth in claim 14 wherein said first and second transistor switching means are each field effect transistors.

17. A system as set forth in claim 16 including field effect transistor driver means interposed between said switch driver control means and each of said field effect transistor means.

18. A RF power amplifier system comprising:

a RF source for providing a train of RF pulses at a fixed frequency with each pulse being of a fixed magnitude and duration;

a DC voltage source;

a plurality of RF power amplifiers, each amplifier including a bridge circuit having a pair of input terminals for connection across a DC voltage source and a pair of output terminals connected across a load;

each said bridge circuit including a first circuit having at least a first transistor switching means for, when on, connecting said DC voltage source across said load for DC current therethrough in a first direction and a second circuit including a second transistor switching means for, when on, connecting said DC voltage source across said load for DC current therethrough in a second direction;

a plurality of switch driver control means each associated with one of said RF power amplifiers for, when enabled, passing said RF pulses for driving said first and second transistor switching means on and off at a frequency dependent upon that of said RF pulses and in such a manner that current from said DC source alternately flows in said first and second directions through said load;

turn-on signal means for providing turn-on signals for enabling at least one of said driver control means in dependence upon the magnitude of an input signal;

each said bridge circuit includes third and fourth transistor switching means; and, wherein said third transistor switching means is connected in series in said second circuit with said second transistor switching means such that when both said second and third transistor switching means are on they connect said DC voltage source across said load for DC current flow therethrough in said second direction and wherein said fourth transistor switching means is connected in series with said first circuit with said first transistor switching means such that when both said first and fourth transistor switching means are on they connect said DC voltage source across said load for DC current flow therethrough in said first direction.

19. A system as set forth in claim 18 wherein said switch driver control means includes logic gating means enabled by a said turn-on signal for passing said RF pulses to said first and second transistor switching means.

20. A system as set forth in claim 19 including a delay means for delaying application of a said turn-on signal to said second transistor switching means.

21. A system as set forth in claim 20 wherein said delay means is interposed between said turn-on signal providing means and said switch driver control means.

22. A system as set forth in claim 21 wherein each of said transistor switching means is a field effect transistor.

23. A system as set forth in claim 22 including field effect transistor driver means interposed between said switch driver control means and each of said field effect transistor means.

24. A system as set forth in claim 23 wherein each said field effect transistor is a MOSFET transistor.

* * * * *